US010522792B1

(12) United States Patent
Jou et al.

(10) Patent No.: US 10,522,792 B1
(45) Date of Patent: Dec. 31, 2019

(54) LUMINANCE AND COLOR TEMPERATURE TUNABLE TANDEM OLED

(71) Applicant: National Tsing Hua University, Hsinchu (TW)

(72) Inventors: Jwo-Huei Jou, Hsinchu (TW); Meenu Singh, New Delhi (IN); Hsin-Fa Lin, Kaohsiung (TW); Cheng-Chieh Lo, Changhua County (TW)

(73) Assignee: National Tsing Hua University (TW)

( * ) Notice: Subject to any disclaimer, the term of this patent is extended or adjusted under 35 U.S.C. 154(b) by 0 days.

(21) Appl. No.: 16/200,627

(22) Filed: Nov. 26, 2018

(30) Foreign Application Priority Data

Jun. 15, 2018 (TW) .............................. 107120821 A

(51) Int. Cl.
| | |
|---|---|
| *H01L 51/52* | (2006.01) |
| *H01L 51/50* | (2006.01) |
| *H05B 33/08* | (2006.01) |
| *H01L 51/00* | (2006.01) |

(52) U.S. Cl.
CPC ........ *H01L 51/5278* (2013.01); *H01L 51/508* (2013.01); *H01L 51/5092* (2013.01); *H01L 51/5206* (2013.01); *H01L 51/5221* (2013.01); *H05B 33/0896* (2013.01); *H01L 51/0035* (2013.01); *H01L 51/0037* (2013.01); *H01L 51/0072* (2013.01); *H01L 51/0085* (2013.01)

(58) Field of Classification Search
CPC .................................................. H01L 51/5278
See application file for complete search history.

(56) References Cited

U.S. PATENT DOCUMENTS

| | | | |
|---|---|---|---|
| 2014/0084255 A1* | 3/2014 | Jou ..................... | H01L 51/5012 257/40 |
| 2016/0260920 A1* | 9/2016 | Rausch ............... | H01L 51/0078 |
| 2017/0229669 A1* | 8/2017 | Rausch ................ | H01L 51/504 |
| 2019/0081264 A1* | 3/2019 | Yun ....................... | H01L 51/504 |

* cited by examiner

*Primary Examiner* — Daniel Whalen

(57) ABSTRACT

Disclosures of the present invention describe a luminance and color temperature tunable (LCTT) tandem OLED, which mainly consists of a transparent conductive substrate, a HTL, a first lighting unit, a first carrier generation unit, a second lighting unit, a second carrier generation unit, a third lighting unit, an ETL, and a cathode electrode. The first lighting unit is designed to emit a cold-white light, a pure-white light or an orange-white light, the second lighting unit is designed to emit a warm-white light, and third lighting unit is designed to emit an orange-white light, a pure-white light or a cold-white light corresponding to the first lighting unit. By such arrangement, it is easy for a user to make the LCTT tandem OLED provide an illumination with user-desirable color temperature and illuminance by using a control interface to electrically drive the three lighting units, either individually or simultaneously.

13 Claims, 10 Drawing Sheets

LUMINANCE AND COLOR TEMPERATURE TUNABLE TANDEM OLED

BACKGROUND OF THE INVENTION

1. Field of the Invention

The present invention relates to the technology field of lighting devices, and more particularly to a luminance and color temperature tunable tandem OLED.

2. Description of the Prior Art

It is known that organic light emitting diode (OLED) was initially invented and proposed by Eastman Kodak Company through a vacuum evaporation method. Tang and VanSlyke working for Kodak Company deposited an electron transport material (ETL) such as Alq3 on a transparent indium tin oxide (abbreviated as ITO) glass, thereby forming with an organic layer of aromatic diamine on the ITO glass. Consequently, Tang and VanSlyke further completed the fabrication of an organic electroluminescent (EL) device by letting a metal electrode be vapor-deposited onto the ETL layer. The organic EL device does nowadays become a new generation lighting device or display because of high brightness, fast response speed, light weight, compactness, true color, no difference in viewing angles, without using any backlight plates, and low power consumption.

An ideal white light OLED is demanded to exhibit high luminance and outstanding luminous efficiency in the case of having low current density, and is also demanded to show the same or similar spectral characteristics even if a driving current thereof is modulated in a specific range. It needs to further explain that, an acceptable high current density would be configured to drive a white light OLED when the white light OLED is applied to be principle lighting elements of an illuminance device. However, practical use cases of the illuminance device using the white light OLEDs as lighting elements thereof reveal that, the white light OLED would be subject to thermal degradation after being driven by the high current density for a long time. As a result, the lifetime of the white light OLED is hence shorten.

To overcome this critical issue, Kido et al. reported a tandem OLED comprising multiple light emission units (LEUs) vertically stacked to each other. FIG. 1 shows a cross-sectional view of a conventional tandem OLED. The tandem OLED 1' comprises: a substrate 10', an anode electrode 11', a hole injection layer (HIL) 12', a first hole transport layer (HTL) 13', a blue light emission layer 14', a first electron transport layer (ETL) 15', a first connection layer 16', a second HTL 17', a green emission layer 18', a second ETL 19', a second connection layer 1A', a third HTL 1B, a red emission layer 1C', a third ELT 1D, an electron injection layer (EIL) 1E', and a cathode electrode 1F'.

Compared to the traditional white light OLED, the tandem OLED 1' exhibits higher brightness under the driving of an identical current density, such that the tandem OLED 1' has a longer lifetime than that of the traditional white light OLED. However, inventors of the present invention find that the tandem OLED 1' still shows some drawbacks in practical use, listed as follows:

(1) From FIG. 1, it is understood that, because the tandem OLED 1' mainly comprises a first light emission unit LEU1' consisting of the first HTL 13', the blue light emission layer 14' and the first ETL 15', a second light emission unit LEU2' consisting of the second HTL 17', the green light emission layer 18' and the second ETL 19', and a third light emission unit LEU3' consisting of the third HTL 1B', the red light emission layer 1C' and the third ETL 1D', a driving voltage for the tandem OLED 1' must be correspondingly increased with the adding of the number of the LEUs.

(2) FIG. 2 shows a CIE chromaticity diagram. Three CIE coordinates of a red light, a green light and a blue light respectively emitted from the first light emission unit LEU1', the second light emission unit LEU2' and the third light emission unit LEU3' of the tandem OLED 1' are labeled on the CIE chromaticity diagram. However, owing to the fact that the three light emission unit (LEU1', LEU2' and LEU3') cannot be driven individually, it is difficult or impossible to make the color temperature and luminance of the tandem OLED 1' be tunable by using a particularly-designed electronic circuit.

From above descriptions, it is clear and understood that how to improve or re-design the tandem OLED 1' so as to produce a luminance and color temperature tunable tandem OLED has now became an important issue. Accordingly, inventors of the present application have made great efforts to make inventive research so as to eventually provide a luminance and color temperature tunable tandem OLED.

SUMMARY OF THE INVENTION

The primary objective of the present invention is to provide a luminance and color temperature tunable tandem OLED, mainly comprising: a transparent conductive substrate, a HTL, a first lighting unit, a first carrier generation unit, a second lighting unit, a second carrier generation unit, a third lighting unit, an ETL, and a cathode electrode. In the present invention, the first lighting unit, the second lighting unit and the third lighting unit are particularly designed to be capable of emitting a first light, a second light and a third light, either individually or simultaneously. The first light can be a cold-white light, a pure-white light or an orange-white light, and the second light is a warm-white light either. It is worth noting that, the third light would be an orange-white light, a pure-white light or a cold-white light corresponding to the first light during the operation of the luminance and color temperature tunable tandem OLED. By such arrangement, it is easy for a user to make the luminance and color temperature tunable tandem OLED provide an illumination with user-desirable color temperature and illuminance by operating a controlling and driving unit to electrically drive the three lighting units, either individually or simultaneously.

In order to achieve the primary objective of the present invention, the inventor of the present invention provides one embodiment for the luminance and color temperature tunable tandem OLED, comprising:

a transparent conductive substrate, comprising a transparent substrate and an anode electrode formed on the transparent substrate;

a hole injection layer formed on the anode electrode;

a first lighting unit, being formed on the hole injection layer and comprising a first electron transport layer, a first light emission layer and a first hole transport layer; wherein the first lighting unit is configured to emit a first light, and the first light being a cold-white light, a pure-white light or an orange-white light;

a first carrier generation unit formed on the first lighting unit;

a second lighting unit, being formed on the first carrier generation unit and comprising a second electron transport layer, a second light emission layer and a second hole transport layer; wherein the second lighting unit is configured to emit a second light, and the second light being a warm-white light;

a third carrier generation unit formed on the second lighting unit;

a third lighting unit, being formed on the second carrier generation unit and comprising a third electron transport layer, a third light emission layer and a third hole transport layer; wherein the third lighting unit is configured to emit a third light, and the third light being an orange-white light, a pure-white light or a cold-white light corresponding to the first light;

an electron injection layer formed on the third lighting unit; and a cathode electrode formed on the electron injection layer.

In the embodiment of the CTT tandem OLED, the first carrier generation unit comprises:

a first carrier generation layer formed on the first lighting unit;

a first modulation electrode formed on the first carrier generation layer; and a second carrier generation layer formed on the first modulation electrode.

In the embodiment of the CTT tandem OLED, the second carrier generation unit comprises:

a third carrier generation layer formed on the second lighting unit;

a second modulation electrode formed on the third carrier generation layer; and a fourth carrier generation layer formed on the second modulation electrode.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a luminance and color temperature tunable tandem OLED according to the present invention, embodiments of the present invention will be described in detail with reference to the attached drawings hereinafter.

The present invention discloses a luminance and color temperature tunable tandem OLED, which can be applied in an illuminance device or a display device for being used as at least one principle lighting element. Before starting to clearly describe the luminance and color temperature tunable tandem OLED of the present invention, it needs to explain the classification of orange-white light, pure-white, and cold-white light. Please refer to following Table (1), a specific light provided by a specific lighting device certainly has a corresponding light classification.

TABLE 1

| Color temperature | Light classification |
|---|---|
| <2,500K | Orange-white light |
| 2,500-5,500K | Warm-white light |
| 5,500-6,500K | Pure-white light |
| >6,500K | Cold-white light |

Figure 1:
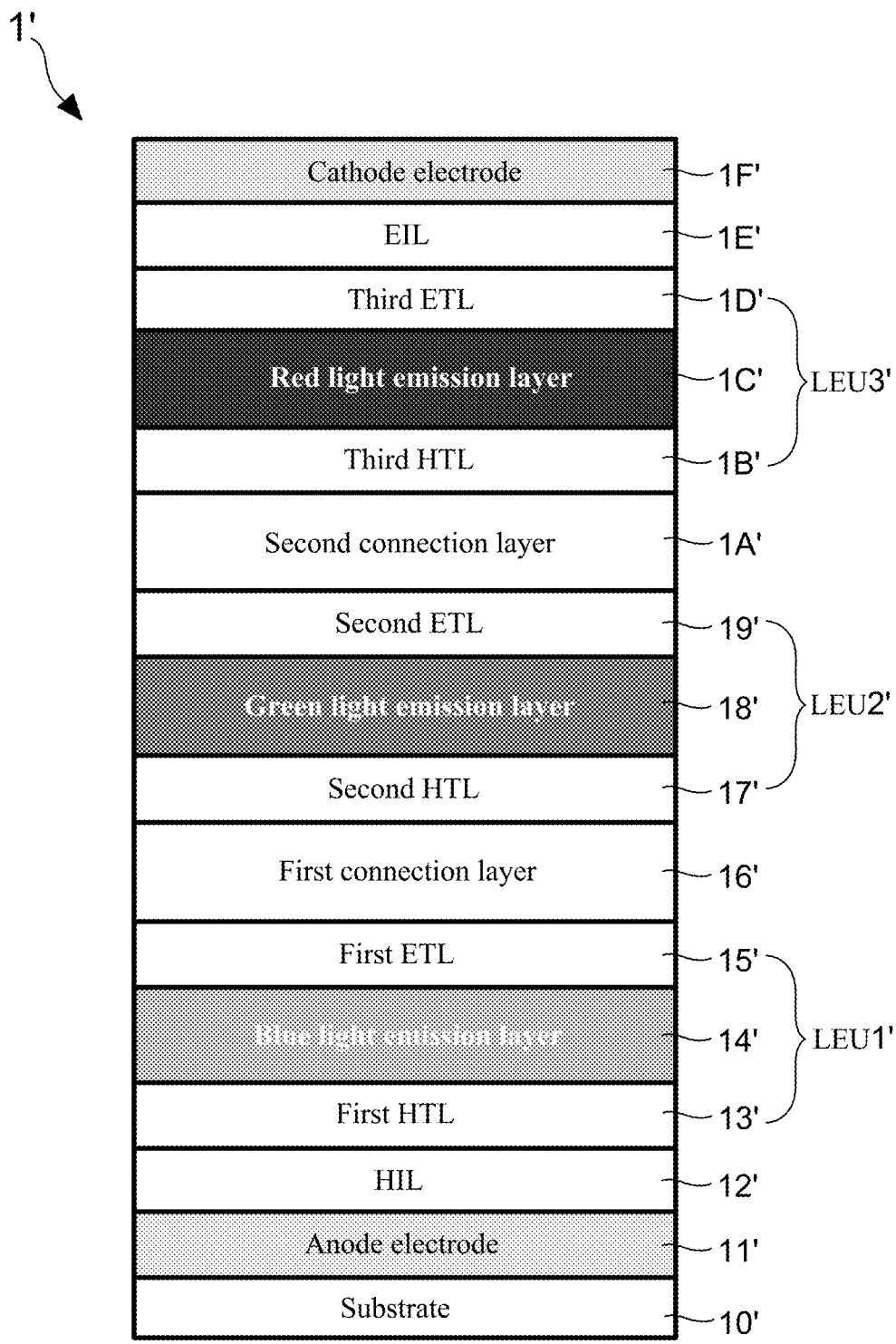
FIG. 1 shows a cross-sectional view of a conventional tandem OLED.
Figure 2:
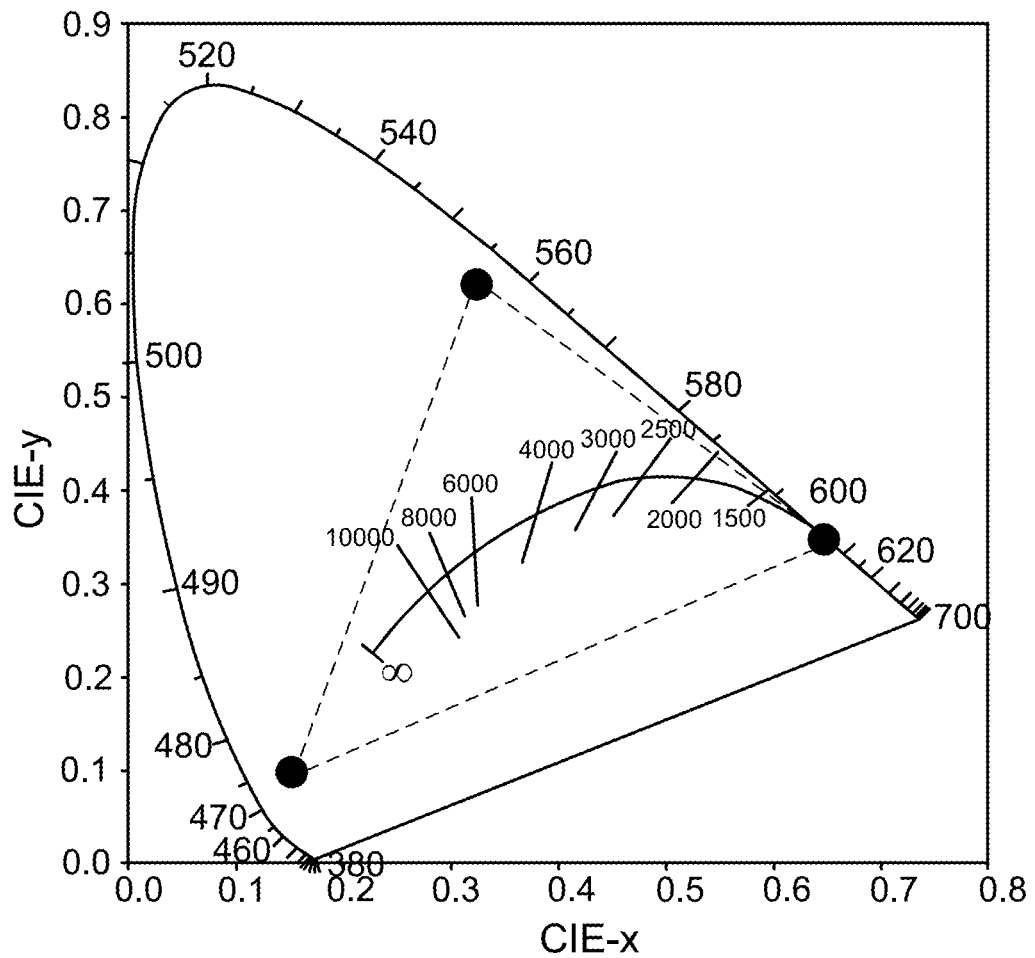
FIG. 2 shows a CIE chromaticity diagram.
Figure 3:
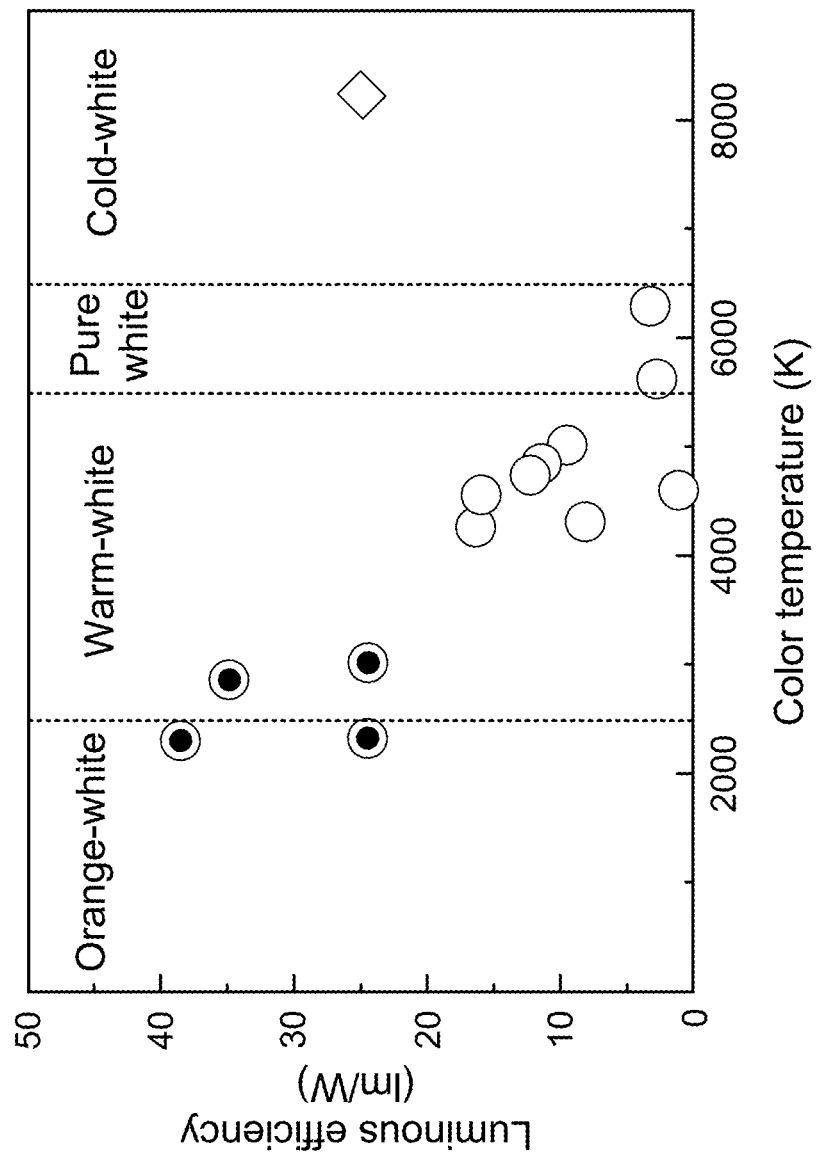
FIG. 3 shows a data plot of color temperature versus power efficiency.
Figure 4:
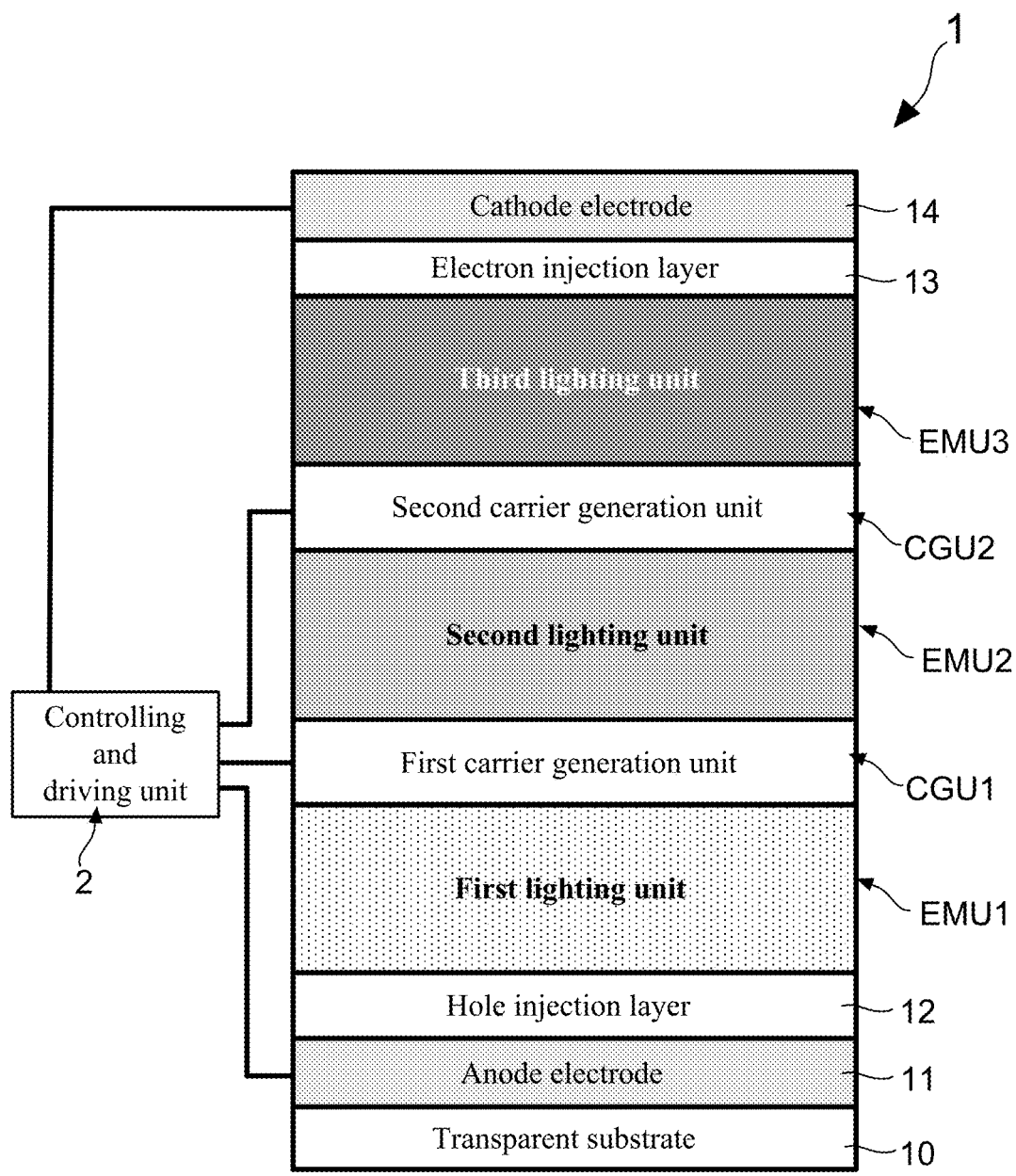
FIG. 4 shows a cross-sectional view of a luminance and color temperature tunable tandem OLED according to the present invention.

With reference to FIG. 4, there is provided a cross-sectional view of a luminance and color temperature tunable tandem OLED according to the present invention. The luminance and color temperature tunable tandem OLED 1 comprises: a transparent conductive substrate comprising a transparent substrate 10 and an anode electrode 11 formed on the transparent substrate 10, a hole injection layer 12 formed on the anode electrode 11, a first lighting unit EMU1 formed on the hole injection layer 12, a first carrier generation unit CGU1 formed on the first lighting unit EMU1, a second lighting unit EMU2 formed on the first carrier generation unit CGU1, a third carrier generation unit CGU3 formed on the second lighting unit EMU2, a third lighting unit EMU3 formed on the second carrier generation unit CGU2, an electron injection layer 13 formed on the third lighting unit EMU3, and a cathode electrode 14 formed on the electron injection layer 13.

The main technology feature of the present invention is to make the first lighting unit EMU1, the second lighting unit EMU2 and the third lighting unit EMU3 emit a first light, a second light and a third light, either individually or simultaneously. According to the particular design of the present invention, the first light can be a cold-white light, a pure-white light or an orange-white light, and the second light is a warm-white light either. It is worth noting that, the third light would be an orange-white light, a pure-white light or a cold-white light corresponding to the first light during the operation of the luminance and color temperature tunable tandem OLED 1. Briefly speaking, the luminance and color temperature tunable tandem OLED 1 of the present invention is configured to simultaneously emit an orange-white light, a warm-white light and a pure-white light (or a cold-white light). Herein, it needs to emphasize that the present does not particularly limit the material composition or formula of the first lighting unit EMU1, the second lighting unit EMU2 and the third lighting unit EMU3, the reason is that engineers skilled in development and manufacture of OLED device should be able to fabricate the same lighting units capable of emitting orange-white light, warm-white light and/or pure-white light according to their own material composition or formula.

Figure 5:
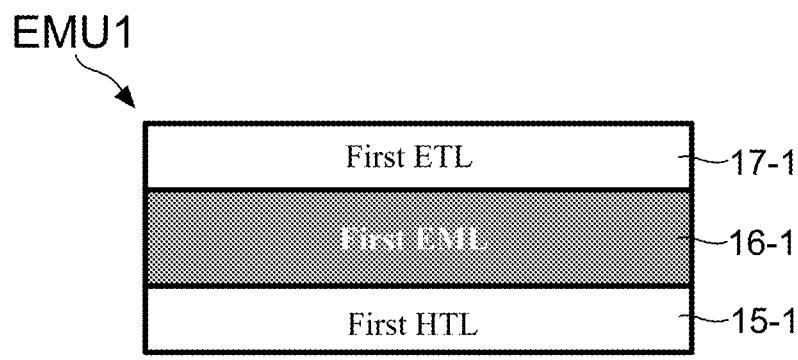
FIG. 5 shows a cross-sectional view of a first lighting unit.
Figure 6:
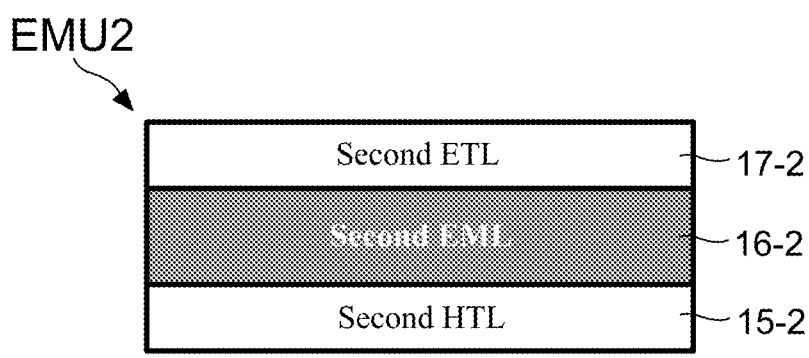
FIG. 6 shows a cross-sectional view of a second lighting unit.
Figure 7:
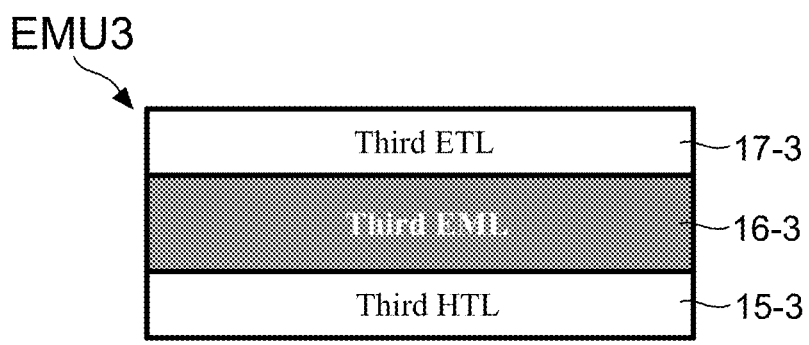
FIG. 7 shows a cross-sectional view of a third lighting unit.

FIG. 5, FIG. 6 and FIG. 7 show different cross-sectional views of the first lighting unit, the second lighting unit and the third lighting unit. From FIG. 5, FIG. 6 and FIG. 7, it is understood that the first lighting unit EMU1 comprises a first electron transport layer (ETL) 17-1, a first light emission layer (EML) 16-1 and a first hole transport layer (HTL) 15-1, the second lighting unit EMU2 comprises a second electron transport layer (ETL) 17-2, a second light emission layer (EML) 16-2 and a second hole transport layer (HTL) 15-2, and the third lighting unit EMU3 comprises a third electron transport layer (ETL) 17-3, a third light emission layer (EML) 16-3 and a third hole transport layer (HTL) 15-3. For making the three lighting units (EMU1, EMU2 and EMU3) able to exhibit outstanding luminous efficiency, it is preferably to make all the first electron transport layer 17-1, the second electron transport layer 17-2 and the third electron transport layer 17-3 by using an electron transport material with hole blocking function, and to simultaneously fabricate all the first hole transport layer 15-1, the second hole transport layer 15-2 and the third hole transport layer 15-3 by using a hole transport material with electron blocking function.

Figure 8:
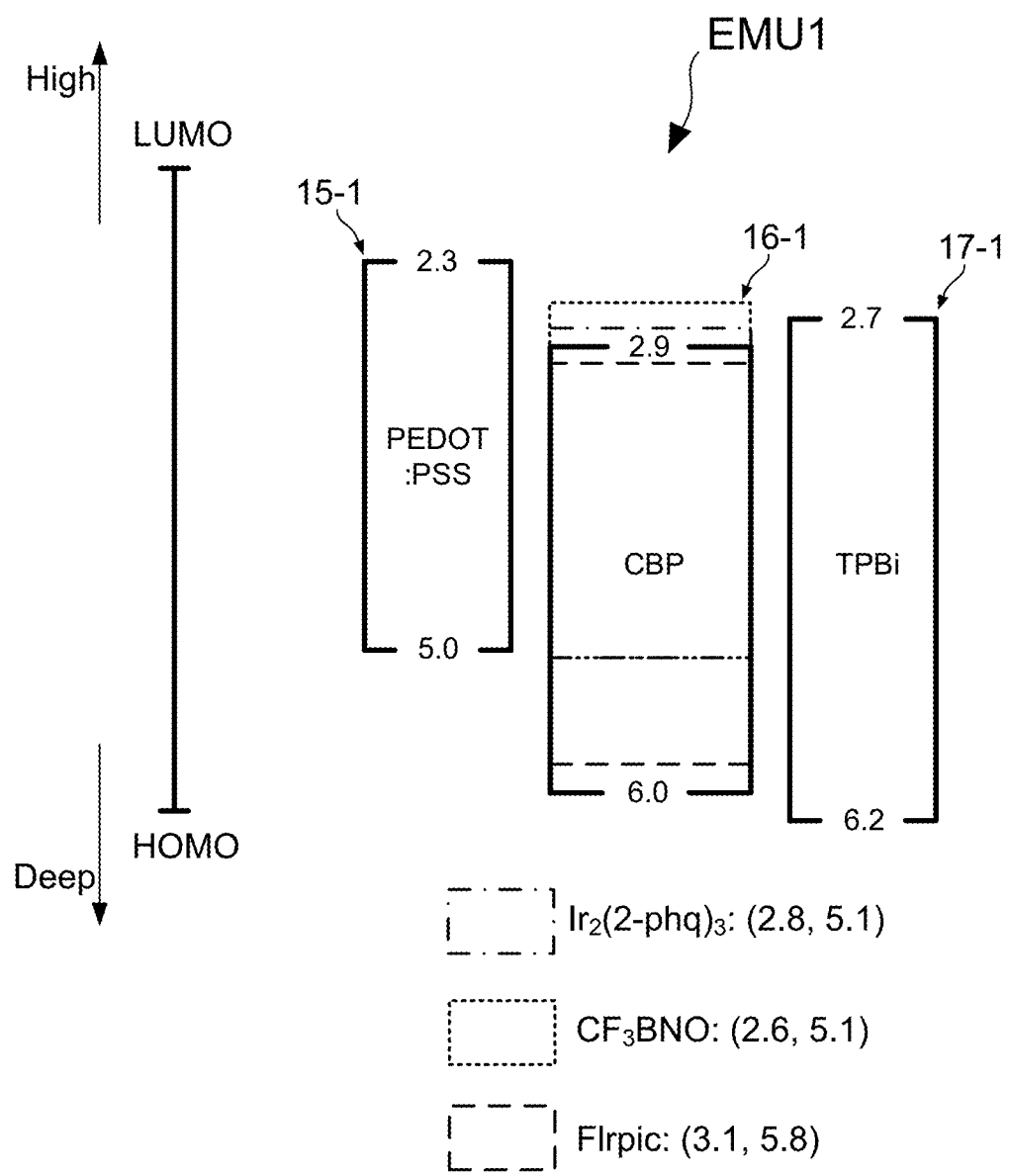
FIG. 8 shows an energy band diagram of the first lighting unit.

Continuously referring to FIG. 5, and please simultaneously refer to FIG. 8, which illustrate an energy band diagram of the first lighting unit. The first lighting unit EMU1 of the luminance and color temperature tunable tandem OLED 1 can be designed to comprise one host material and three guest dyes. Basic information of the constituting material of the first lighting unit EMU1 are provided in following Table (2).

TABLE 2

| Constituting layers | Manufacturing materials |
|---|---|
| First HTL 15-1 | poly(3,4-ethylenedioxythiophene) polystyrene sulfonate (PEDOT:PSS) |
| Host material | 4,4'-Bis(N-carbazolyl)-1,1'-biphenyl (CBP) |
| Guest dye (red) | Tris(2-phenylquinoline)iridium(III) (Ir(2-phq)$_3$) |
| Guest dye (green) | Bis[5-methyl-7-trifluoromethyl-5H-benzo(c)(1,5)naph-thyridin-6-one]iridium(picolinate) (CF$_3$BNO) |
| Guest dye (blue) | Bis(3,5-difluoro-2-(2-pyridyl)phenyl-(2carboxy-pyridl)iridium(III)) (FIrpic) |
| First ETL 17-1 | 2,2',2''-(1,3,5-Benzinetriyl)-tris(1-phenyl-1-H-benzimidazole) (TPBi) |

Figure 9:
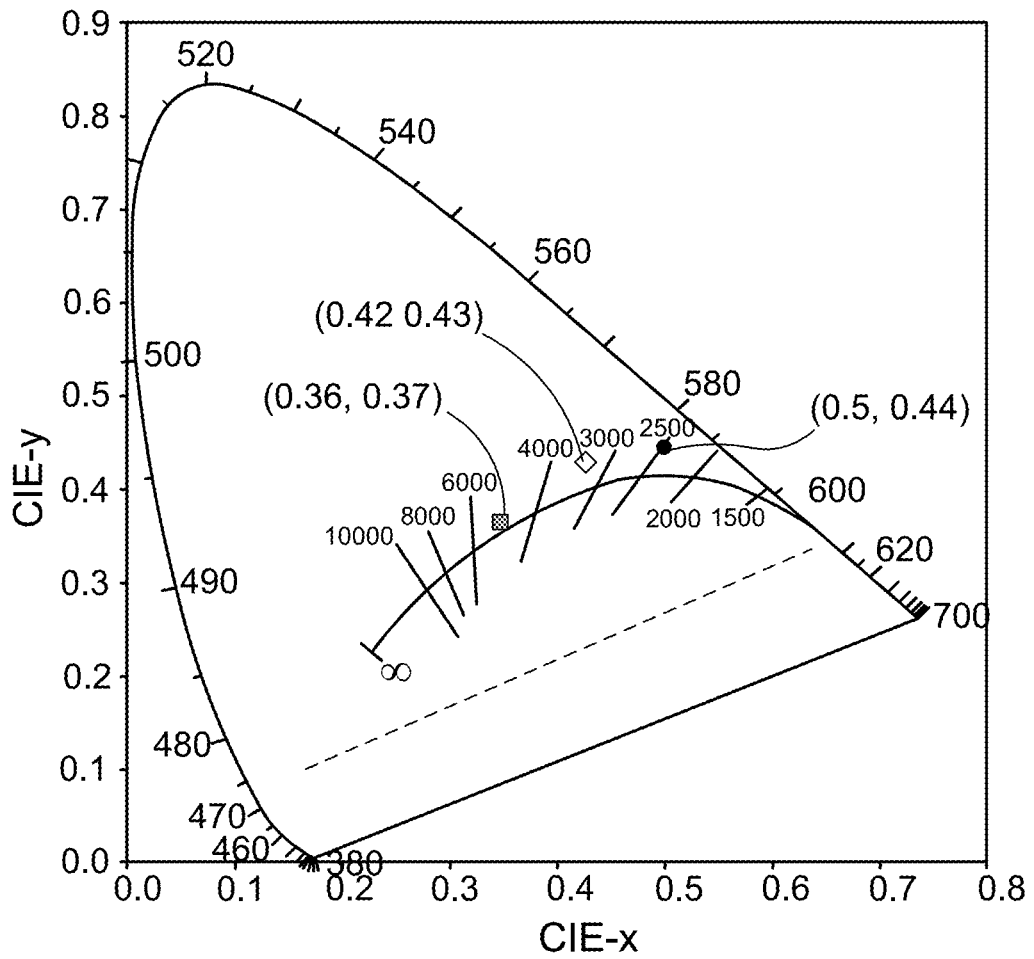
FIG. 9 shows a CIE chromaticity diagram.

It needs to further explain that the red guest dye of Ir(2-phq)$_3$, the green guest dye of CF$_3$BNO, and the blue guest dye of FIrpic are doped in the host material by 0.6 wt %, 0.2 wt % and 8 wt %, respectively. On the other hand, FIG. 9 shows a CIE chromaticity diagram. From FIG. 9, it is found that the orange-white light emitted from the first lighting unit EMU1 has a CIE coordinate of (0.5, 0.44). It is worth particularly emphasizing that, although FIG. 5 depicts that the first EML 16-1 of the first lighting unit EMU1 has a single-layer structure, the construction of the first EML 16-1 does not be limit to be the single-layer structure. For example, U.S. Pat. No. 8,809,848 B1 has disclosed that a light emission layer can be particular design to has a multi-layer structure, therefore such light emission layer is able to emit a full-band and high-CRI light. On the other hand, U.S. Patent Publication No. 2012/049166 A1 has disclosed that a light emission unit can be particular design to has a three-layer structure including two emission layers and one carrier modulation layer formed between the two emission layers.

Figure 10:
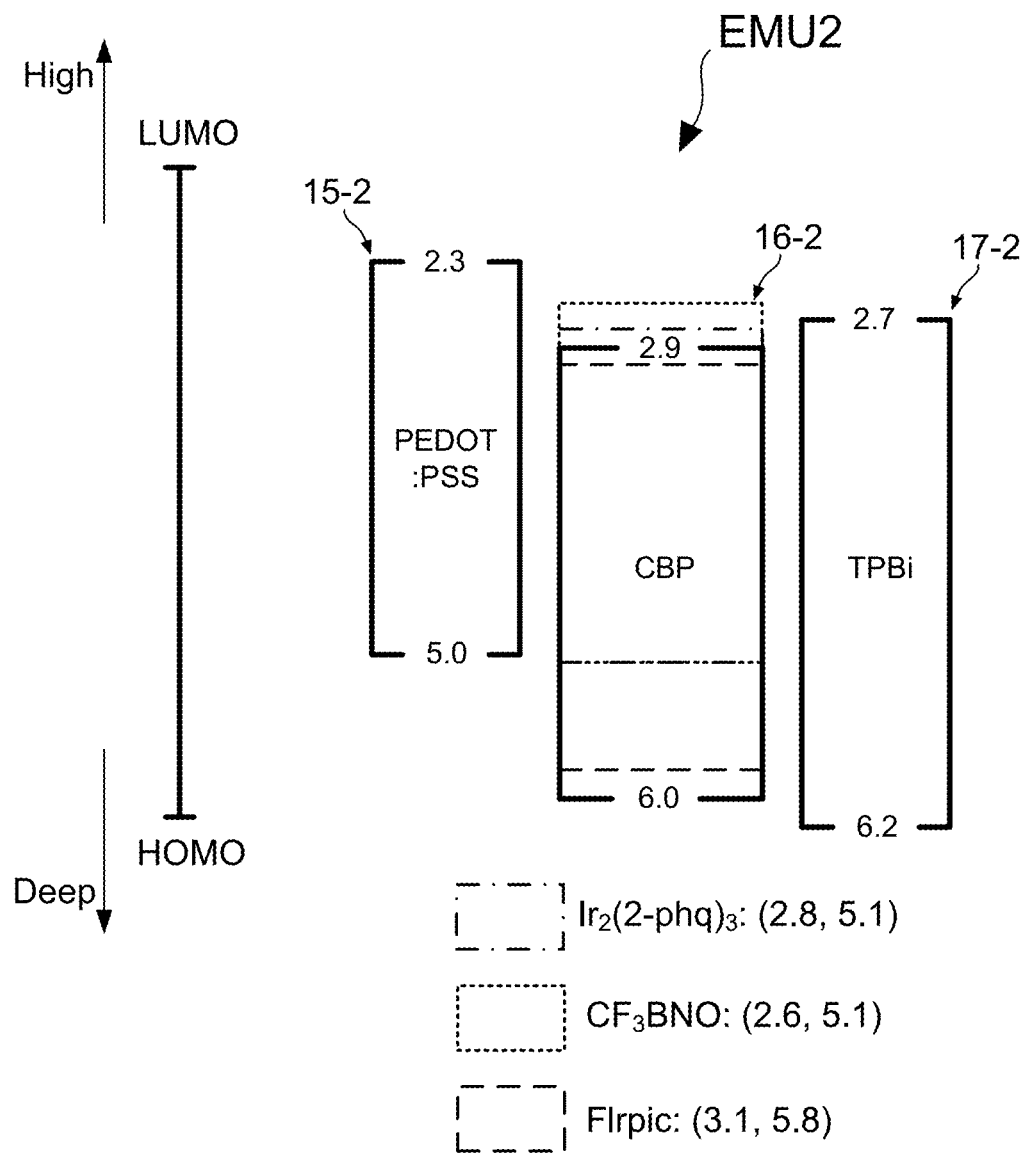
FIG. 10 shows an energy band diagram of the second lighting unit.

Continuously referring to FIG. 6, and please simultaneously refer to FIG. 10, which illustrate an energy band diagram of the second lighting unit. The second lighting unit EMU2 of the luminance and color temperature tunable tandem OLED 1 can be designed to comprise one host material and three guest dyes. Basic information of the constituting material of the second lighting unit EMU2 are provided in following Table (3).

TABLE 3

| Constituting layers | Manufacturing materials |
|---|---|
| Second HTL 15-2 | poly(3,4-ethylenedioxythiophene) polystyrene sulfonate (PEDOT:PSS) |
| Host material | 4,4'-Bis(N-carbazolyl)-1,1'-biphenyl (CBP) |
| Guest dye (red) | Tris(2-phenylquinoline)iridium(III) (Ir(2-phq)$_3$) |
| Guest dye (green) | Bis[5-methyl-7-trifluoromethyl-5H-benzo(c)(1,5)naph-thyridin-6-one]iridium(picolinate) (CF$_3$BNO) |
| Guest dye (blue) | Bis(3,5-difluoro-2-(2-pyridyl)phenyl-(2carboxypyridyl)iridium(III)) (FIrpic) |
| Second ETL 17-2 | 2,2',2''-(1,3,5-Benzinetriyl)-tris(1-phenyl-1-H-benzimidazole) (TPBi) |

It needs to further explain that the red guest dye of Ir(2-phq)$_3$, the green guest dye of CF$_3$BNO, and the blue guest dye of FIrpic are doped in the host material by 0.6 wt %, 0.4 wt % and 14 wt %, respectively. Moreover, it is able to find that the warm-white light emitted from the second lighting unit EMU2 has a CIE coordinate of (0.42, 0.43).

Figure 11:
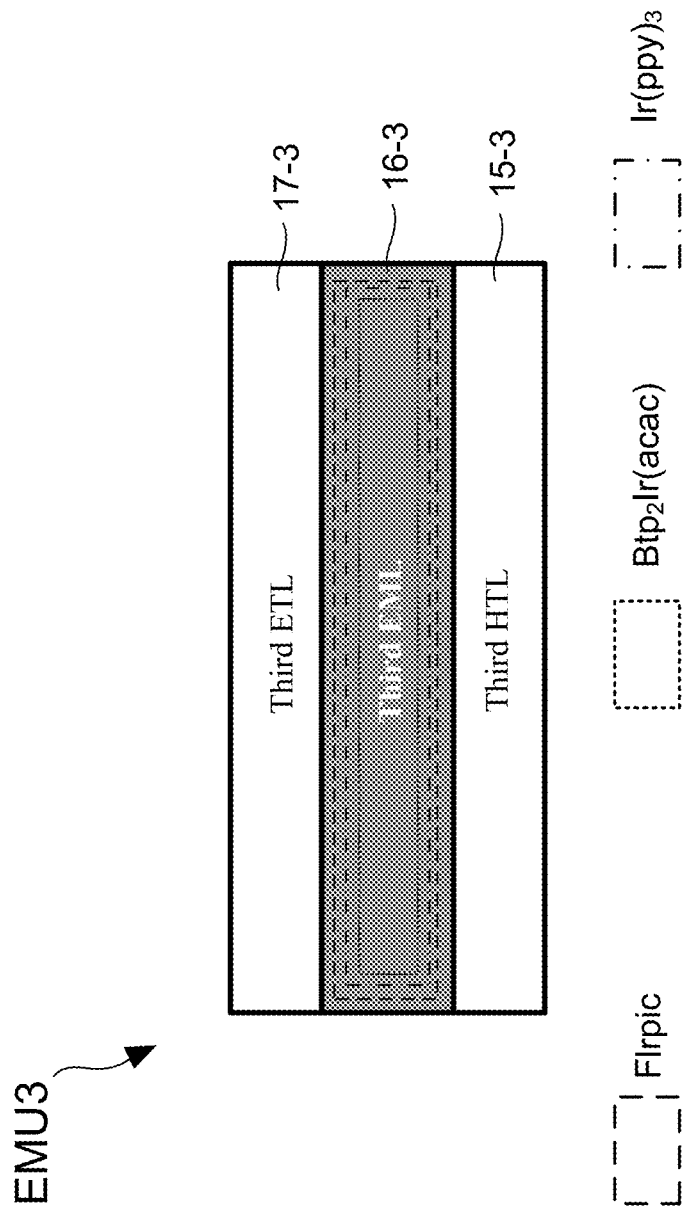
FIG. 11 shows a cross-sectional view of the third lighting unit.

Continuously referring to FIG. 7, and please simultaneously refer to FIG. 11, which illustrate a cross-sectional view of the third lighting unit. The third lighting unit EMU3 of the luminance and color temperature tunable tandem OLED 1 can be designed to comprise one host material and three guest dyes. Basic information of the constituting material of the third lighting unit EMU3 are provided in following Table (4).

TABLE 4

| Constituting layers | Manufacturing materials |
|---|---|
| Third HTL 15-3 | poly(3,4-ethylenedioxythiophene) polystyrene sulfonate (PEDOT:PSS) |
| Host material | 4,4'-Bis(N-carbazolyl)-1,1'-biphenyl (CBP) |
| Guest dye (red) | Bis[2-(2'-benzothienyl)-pyridinato-N, 3'](acetylacetonate) iridium (III) (Btp$_2$Ir(acac)) |
| Guest dye (green) | Tris[2-phenylpyridinato-C2,N]iridium(III) (Ir(ppy)$_3$) |
| Guest dye (blue) | Bis(3,5-difluoro-2-(2-pyridyl)phenyl-(2carboxypyridyl)iridium(III)) (FIrpic) |
| Third ETL 17-3 | Tris(8-hydroxyquinoline) aluminum (Alq$_3$) |

It needs to further explain that the red guest dye of Btp$_2$Ir(acac), the green guest dye of Ir(ppy)$_3$, and the blue guest dye of FIrpic are doped in the host material by 0.35 wt %, 0.4 wt % and 12 wt %, respectively. Moreover, it is able to find that the pure-white light emitted from the third lighting unit EMU3 has a CIE coordinate of (0.36, 0.37).

Figure 12:
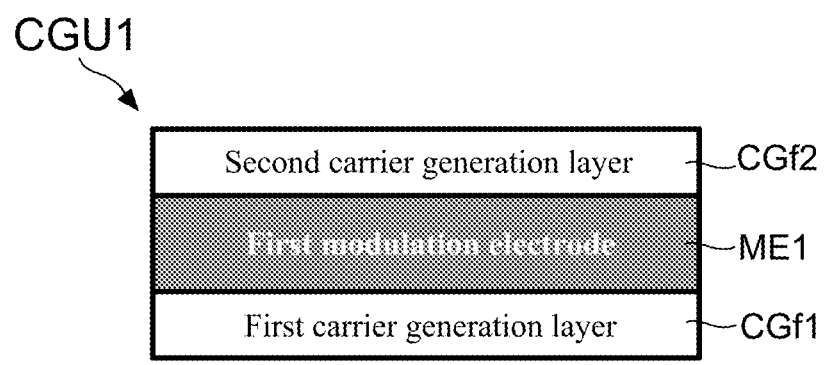
FIG. 12 shows a cross-sectional view of a first carrier generation unit.
Figure 13:
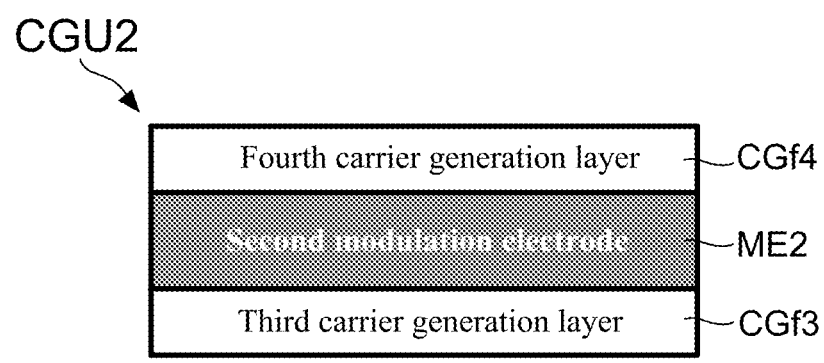
FIG. 13 shows a cross-sectional view of a second carrier generation unit.

FIG. 4 also depicts that the first carrier generation unit CGU1 is disposed between the first lighting unit EMU1 and the second lighting unit EMU2, and the second carrier generation unit CGU2 is disposed between the second lighting unit EMU2 and the third lighting unit EMU3. FIG. 12 and FIG. 13 further show different cross-sectional views of the first carrier generation unit and the second carrier generation unit. In the present invention, the first carrier generation unit CGU1 comprises a first carrier generation layer CGf1 formed on the first lighting unit EMU1, a first modulation electrode ME1 formed on the first carrier generation layer CGf1, and a second carrier generation layer CGf1 formed on the first modulation electrode ME1. Moreover, the second carrier generation unit CGU2 comprises a third carrier generation layer CGf3 formed on the second lighting unit EMU2, a second modulation electrode ME2 formed on the third carrier generation layer CGf3, and a fourth carrier generation layer CGf4 formed on the second modulation electrode ME2.

Both the first carrier generation layer CGf1 and the third carrier generation layer CGf3 can be made of a n-type carrier generation material, such as poly(ethylene glycol) dimethyl ether (PEGDE). On the contrary, both the second carrier generation layer CGf2 and the fourth carrier generation layer CGf4 are made of a p-type carrier generation material like NPB doped with F4-TCNQ. In which, NPB is N'-Bis (naphthalen-1-yl)-N,N'-bis(phenyl)benzidine, and F4-TCNQ is 2,3,5,6-Tetrafluoro-7,7,8,8-tetracyanoquinodimethane. On the other hand, an electron injection material can also be adopted for use in the fabrication of the first carrier generation layer CGf1 and the third carrier generation layer CGf3, a hole injection material can also be used for making the second carrier generation layer CGf2 and the fourth carrier generation layer CGf4.

Please refer to FIG. 4, FIG. 12 and FIG. 13 again. According to the particular design of the present invention, a controlling and driving unit 2 is provided so as to be electrically connected to the anode electrode 11, the first modulation electrode ME1 of the first carrier generation unit CGU1, the second modulation electrode ME2 of the second carrier generation unit CGU2, and the cathode electrode 14. By such arrangement, it is easy for a user to make the luminance and color temperature tunable tandem OLED 1 provide an illumination with user-desirable color temperature and illuminance by using an user interface of the controlling and driving unit 2 to electrically drive the three lighting units (EMU1, EMU2 and EMU3), either individually or simultaneously.

For instance, in the case of the fact that the first lighting unit EMU1, the second lighting unit EMU2 and the third lighting unit EMU3 are respectively design to a high color temperature lighting element, a middle color temperature lighting element and a low color temperature lighting element, the controlling and driving unit 2 is configured for supplying a positive bias voltage to the anode electrode 11 and the cathode electrode 14 so as to drive the three lighting units (EMU1, EMU2 and EMU3) to generate three different emission lights. In this case, by operating the controlling and driving unit 2 to supply a negative bias voltage to the first modulation electrode ME1 and/or the second modulation electrode ME2, the luminance and color temperature tunable tandem OLED 1 is hence controlled to provide an illumination with user-desirable color temperature and illuminance because the light emission of the first lighting unit EMU1, the second lighting unit EMU2, and/or the third lighting unit EMU3 are conditionally inhibited, either individually or simultaneously.

Therefore, through above descriptions, the luminance and color temperature tunable tandem OLED 1 proposed by the present invention has been introduced completely and clearly; in summary, the present invention includes the advantages of:

(1) The present invention provides a luminance and color temperature tunable tandem OLED, which comprises a transparent conductive substrate, a HTL 12, a first lighting unit EMU1, a first carrier generation unit CGU1, a second lighting unit EMU2, a second carrier generation unit CGU2, a third lighting unit EMU3, an ETL 13, and a cathode electrode 14. In the present invention, the first lighting unit EMU1, the second lighting unit EMU2 and the third lighting unit EMU3 are particularly designed to be capable of emitting a first light, a second light and a third light, either individually or simultaneously. The first light can be a cold-white light, a pure-white light or an orange-white light, and the second light is a warm-white light either. It is worth noting that, the third light would be an orange-white light, a pure-white light or a cold-white light corresponding to the first light during the operation of the luminance and color temperature tunable tandem OLED 1. By such arrangement, it is easy for a user to make the luminance and color temperature tunable tandem OLED 1 provide an illumination with user-desirable color temperature and illuminance by operating the controlling and driving unit 2 to electrically drive the three lighting units (EMU1, EMU2 and EMU3), either individually or simultaneously.

The above description is made on embodiments of the present invention. However, the embodiments are not intended to limit scope of the present invention, and all equivalent implementations or alterations within the spirit of the present invention still fall within the scope of the present invention.

What is claimed is:

1. A luminance and color temperature tunable tandem OLED, comprising:
   a transparent conductive substrate, comprising a transparent substrate and an anode electrode formed on the transparent substrate;
   a hole injection layer formed on the anode electrode;
   a first lighting unit, being formed on the hole injection layer and comprising a first electron transport layer, a first light emission layer and a first hole transport layer; wherein the first lighting unit is configured to emit a first light, and the first light being a cold-white light, a pure-white light or an orange-white light;
   a first carrier generation unit, being formed on the first lighting unit, and having a first modulation electrode;
   a second lighting unit, being formed on the first carrier generation unit, such that the first carrier generation unit is connected between the second lighting unit and the first lighting unit; wherein the second lighting unit comprises a second electron transport layer, a second light emission layer and a second hole transport layer, and being configured to emit a second light, and the second light being a warm-white light;
   a second carrier generation unit, being formed on the second lighting unit, and having a second modulation electrode;
   a third lighting unit, being formed on the second carrier generation unit, such that the second carrier generation unit is connected between the third lighting unit and the second lighting unit; wherein the third lighting unit comprises a third electron transport layer, a third light emission layer and a third hole transport layer, and being configured to emit a third light, and the third light being an orange-white light, a pure-white light or a cold-white light corresponding to the first light;
   an electron injection layer formed on the third lighting unit; and
   a cathode electrode formed on the electron injection layer;
   wherein the anode electrode, the first modulation electrode of the first carrier generation unit, the second modulation electrode of the second carrier generation unit, and the cathode electrode are configured for being electrically connected to an external controlling and driving unit.

2. The luminance and color temperature tunable tandem OLED of claim 1, wherein each of the first light emission layer, the second light emission layer and the third light emission layer comprises at least one host material and at least two guest dyes.

3. The luminance and color temperature tunable tandem OLED of claim 1, wherein each of the first light emission layer, the second light emission layer and the third light emission layer comprises at least one host material and at least one guest dye.

4. The luminance and color temperature tunable tandem OLED of claim 1, wherein each of the first light emission layer, the second light emission layer and the third light emission layer comprises two host materials and at least one guest dye, and the two host materials being separated by a carrier modulation film.

5. The luminance and color temperature tunable tandem OLED of claim 1, wherein all the first electron transport layer, the second electron transport layer and the third electron transport layer has hole blocking function.

6. The luminance and color temperature tunable tandem OLED of claim 1, wherein all the first hole transport layer, the second hole transport layer and the third hole transport layer has electron blocking function.

7. The luminance and color temperature tunable tandem OLED of claim 1, wherein the first carrier generation unit comprises:
a first carrier generation layer formed on the first lighting unit; and
a second carrier generation layer, being formed on the first modulation electrode, such that the first modulation electrode is connected between the first carrier generation layer and the second carrier generation layer.

8. The luminance and color temperature tunable tandem OLED of claim 7, wherein the second carrier generation unit comprises:
a third carrier generation layer formed on the second lighting unit; and
a fourth carrier generation layer, being formed on the second modulation electrode such that the second modulation electrode is connected between the third carrier generation layer and the fourth carrier generation layer.

9. The luminance and color temperature tunable tandem OLED of claim 8, wherein both the first carrier generation layer and the third carrier generation layer are made of an n-type carrier generation material.

10. The luminance and color temperature tunable tandem OLED of claim 8, wherein both the first carrier generation layer and the third carrier generation layer are made of an electron injection material.

11. The luminance and color temperature tunable tandem OLED of claim 8, wherein both the second carrier generation layer and the fourth carrier generation layer are made of a p-type carrier generation material.

12. The luminance and color temperature tunable tandem OLED of claim 8, wherein both the second carrier generation layer and the fourth carrier generation layer are made of a hole injection material.

13. The luminance and color temperature tunable tandem OLED of claim 1, being applied in an illuminance device or a display device for being used as at least one principle lighting element.

* * * * *